US010388729B2

(12) United States Patent
Zhang et al.

(10) Patent No.: US 10,388,729 B2
(45) Date of Patent: Aug. 20, 2019

(54) DEVICES AND METHODS OF FORMING SELF-ALIGNED, UNIFORM NANO SHEET SPACERS

(71) Applicant: GLOBALFOUNDRIES Inc., Grand Cayman (KY)

(72) Inventors: John Zhang, Altamont, NY (US); Lawrence Clevenger, Rhinebeck, NY (US); Kangguo Cheng, Schenectady, NY (US); Balasubramanian Haran, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/155,761

(22) Filed: May 16, 2016

(65) Prior Publication Data

US 2017/0330934 A1 Nov. 16, 2017

(51) Int. Cl.
*H01L 29/06* (2006.01)
*H01L 29/66* (2006.01)
*H01L 21/306* (2006.01)
*H01L 21/311* (2006.01)
*H01L 29/786* (2006.01)
(Continued)

(52) U.S. Cl.
CPC .... *H01L 29/0665* (2013.01); *H01L 21/30604* (2013.01); *H01L 21/31116* (2013.01); *H01L 21/823437* (2013.01); *H01L 21/823468* (2013.01); *H01L 29/165* (2013.01); *H01L 29/6653* (2013.01); *H01L 29/66545* (2013.01); *H01L 29/786* (2013.01)

(58) Field of Classification Search
CPC . H01L 29/0665; H01L 29/786; H01L 29/165; H01L 21/30604; H01L 21/31116; H01L 29/6653; H01L 21/823437; H01L 29/66545; H01L 21/823468
See application file for complete search history.

(56) References Cited

U.S. PATENT DOCUMENTS 6,528,376 B1 3/2003 Guo
2007/0111532 A1* 5/2007 Lee .................. C09K 13/08
438/745

(Continued)

*Primary Examiner* — Steven H Loke
*Assistant Examiner* — Juanita B Rhodes
(74) *Attorney, Agent, or Firm* — Thompson Hine LLP; Francois Pagette

(57) ABSTRACT

Devices and methods of fabricating integrated circuit devices for forming uniform nano sheet spacers self-aligned to the channel are provided. One method includes, for instance: obtaining an intermediate semiconductor device having a substrate, multiple layers disposed on the substrate, and at least one gate structure disposed on the multiple layers; depositing an oxide layer over the device; etching the oxide layer to form replacement sidewall spacers positioned on left and right sides of the at least one gate structure; etching the multiple layers to form at least one stack structure; and forming a plurality of recesses within the at least one stack structure. Also disclosed is an intermediate semiconductor, which includes, for instance: a substrate; and at least one stack structure disposed on the substrate, the at least one stack structure having an upper portion and a base portion, wherein a plurality of recesses are located within the base portion.

10 Claims, 8 Drawing Sheets

(51) Int. Cl.
*H01L 21/8234* (2006.01)
*H01L 29/165* (2006.01)

(56) References Cited

U.S. PATENT DOCUMENTS

| | | | |
|---|---|---|---|
| 2009/0179283 A1* | 7/2009 | Adams | H01L 21/82345 257/411 |
| 2010/0295024 A1* | 11/2010 | Pernel | B82Y 10/00 257/24 |
| 2013/0102130 A1* | 4/2013 | Cheng | H01L 29/66477 438/478 |
| 2015/0099368 A1* | 4/2015 | Shen | H01L 21/3065 438/718 |
| 2016/0211322 A1* | 7/2016 | Kim | H01L 29/66795 |
| 2017/0053998 A1* | 2/2017 | Kim | H01L 29/42392 |

* cited by examiner

DEVICES AND METHODS OF FORMING SELF-ALIGNED, UNIFORM NANO SHEET SPACERS

FIELD OF THE INVENTION

The present invention relates to semiconductor devices and methods of fabricating semiconductor devices, and more particularly, to devices and methods of forming uniform nano sheet spacers that are self-aligned to the channel.

BACKGROUND OF THE INVENTION

Nano sheet transistors may be promising candidate for 5 nm and beyond nodes, in view of the continually increasing demand for smaller circuit structures and faster device performance. The current methods, however, involve complicated silicon sheet recess and divot fill process, without an appropriate process control on the spacer uniformity.

Therefore, it may be desirable to develop methods of fabricating nano sheet transistor structures having uniform nano sheet spacers using a more simplified process.

BRIEF SUMMARY

The shortcomings of the prior art are overcome and additional advantage are provided through the provisions, in one aspect, a method that includes, for instance: obtaining an intermediate semiconductor device having a substrate, multiple layers disposed on the substrate, and at least one gate structure disposed on the multiple layers; depositing an oxide layer over the device; etching the oxide layer to form replacement sidewall spacers positioned on left and right sides of the at least one gate structure; etching the multiple layers to form at least one stack structure; and forming a plurality of recesses within the at least one stack structure.

In another aspect, an intermediate semiconductor device is provided which includes, for instance: a substrate; and at least one stack structure disposed on the substrate, the at least one stack structure having an upper portion and a base portion, wherein a plurality of recesses are located within the base portion.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with uniform nano sheet spacers using a more simplified process.

Figure 1:
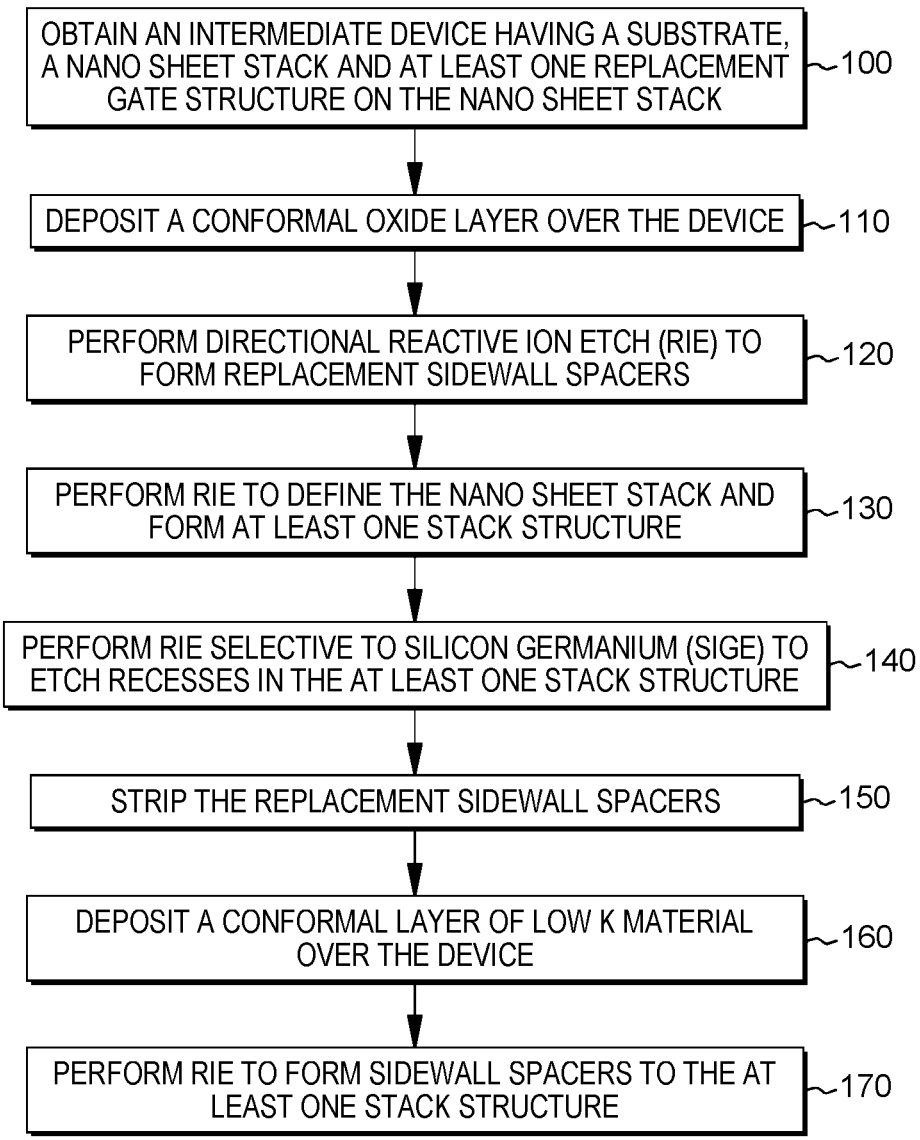
FIG. 1 depicts one embodiment of a method for forming an intermediate semiconductor structure, in accordance with one or more aspects of the present invention.

In one aspect, in one embodiment, as shown in FIG. 1, an integrated circuit device formation process in accordance with one or more aspects of the present invention may include, for instance: obtaining an intermediate device having a substrate, a nano sheet stack and at least one replacement gate structure on the nano sheet stack 100; depositing a conformal oxide layer over the device 110; performing directional reactive ion etch (RIE) to form replacement sidewall spacers 120; performing RIE to define the nano sheet stack and form at least one stack structure 130; performing RIE selective to silicon germanium (SiGe) to etch recesses in the at least one stack structure 140; stripping the replacement sidewall spacers 150; depositing a conformal layer of low k material over the device 160; and performing RIE to form sidewall spacers to the at least one stack structure.

FIGS. 2-8 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
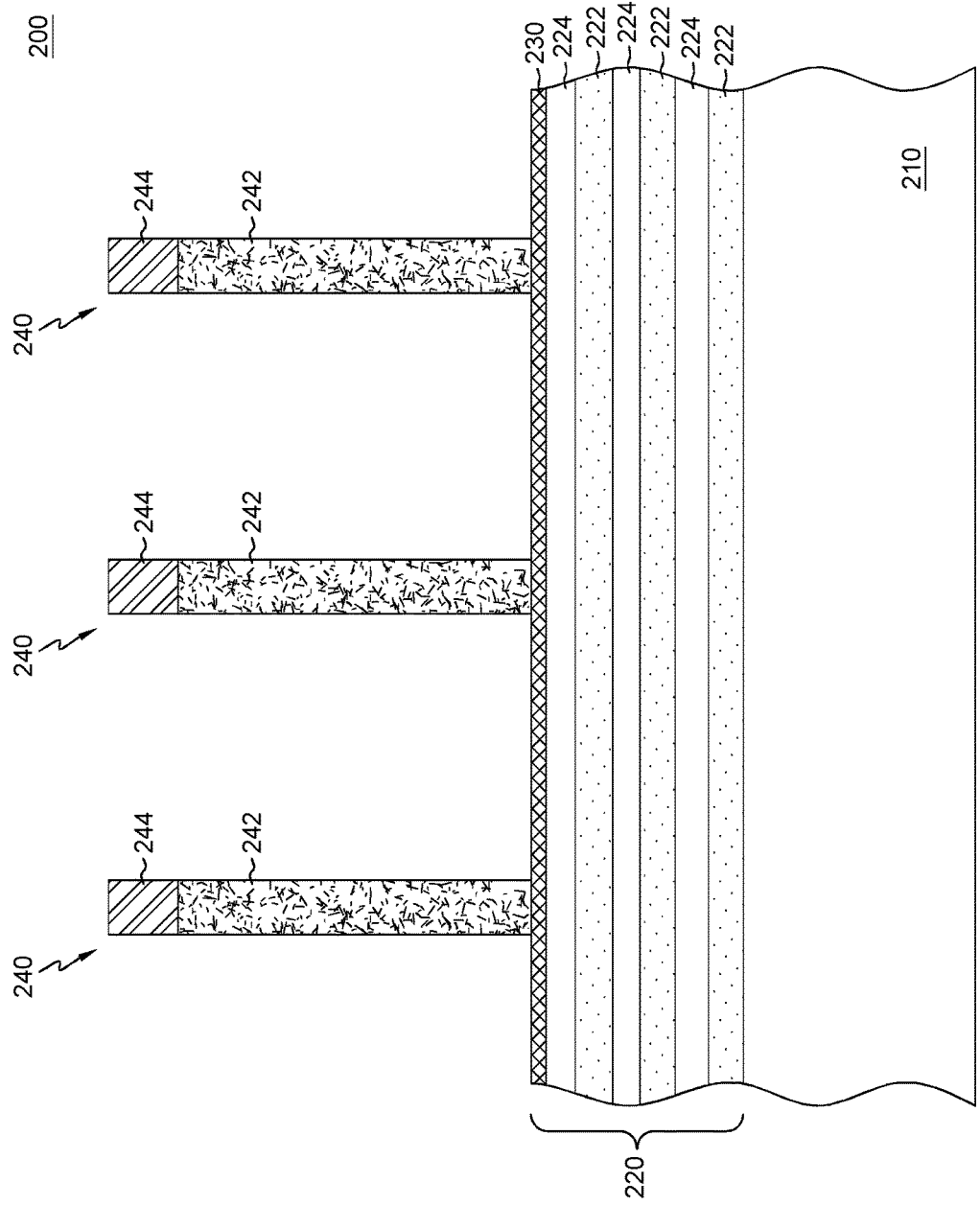
FIG. 2 depicts a cross-sectional elevation view of one embodiment of an intermediate semiconductor structure having a substrate, multiple layers disposed on the substrate, an oxide pad layer on the multiple layers, and gate structures disposed on the oxide pad layer, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated. For example, the device 200 may include, for instance, a substrate 210 with multiple layers 220 disposed on the substrate. The substrate 210 may be any suitable material, for example, silicon.

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure.

As illustrated in FIG. 2, the multiple layers 220 may include, for example, multiple alternating layers of a first material layer 222, such as silicon germanium (SiGe) layer and a second material layer 224, such as silicon (Si) silicon. The multiple layers 220 may follow the pattern of a first material layer 222 on the substrate 210, a second material layer 224 on the first material layer 222, another first material layer 222 on the second material layer 224, another second material layer 224 on the first material layer 222, and so on. For instance, the multiple layers 220 may include 3 SiGe layers alternating with 3 Si layers, such that a first SiGe layer is disposed on the substrate, a first Si layer is disposed on the first SiGe layer, a second SiGe layer is disposed on the first Si layer, a second Si layer is disposed on the second SiGe layer, a third SiGe layer is disposed on the second Si layer, and a third Si layer is disposed on the third SiGe layer, as shown in FIG. 2. The multiple layers 220 is not limited to any particular number of alternating layers of first material layer 222 and second material layer 224, and may include additional alternating layers, for example, 4 layers of SiGe alternating with 4 layers of Si, 5 layers of SiGe alternating with 5 layers of Si, and so forth, following the pattern as detailed above. The multiple layers 220 may also be referred to as, for example, a nano sheet.

As also depicted in FIG. 2, the device 200 may also have an oxide pad layer 230, which may be disposed on the multiple layers 220. The device 200 may also include at least one gate structure 240 disposed on the oxide pad layer 230. The gate structure 240 may include, for example, a gate 242 and a gate hard mask 244 disposed on top of the gate. The gate 242 and the gate hard mask 244 may be of any suitable material, such as, amorphous silicon and silicon nitride (SiN), respectively. An oxide layer (not shown), such as silicon dioxide ($SiO_2$), may be deposited over the device 200 and may form a conformal layer over the device 200.

Figure 3:
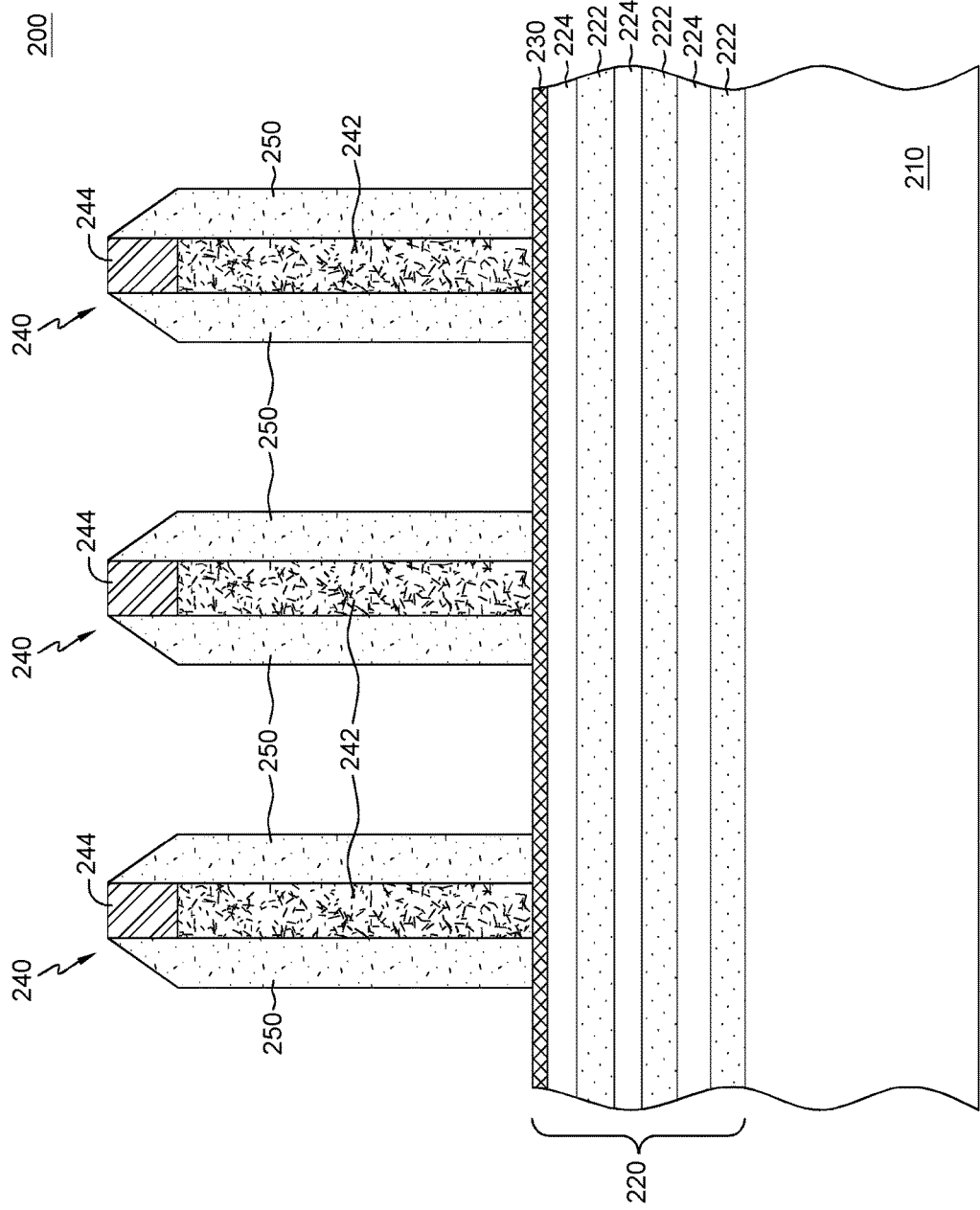
FIG. 3 depicts the structure of FIG. 2 after forming replacement sidewall spacers on the sides of the gate structures, in accordance with one or more aspects of the present invention.

As depicted in FIG. 3, using lithography and etching processes, the oxide layer (not shown) may be etched to define and form replacement sidewall spacers 250 positioned on the left and right sides of the at least one gate structure 240, i.e. a spacer 250 on the left side and a spacer 250 on the right side of the gate structure 240. The etching may be performed by any suitable etching process, for example, a directional reactive ion etching (RIE).

Figure 4:
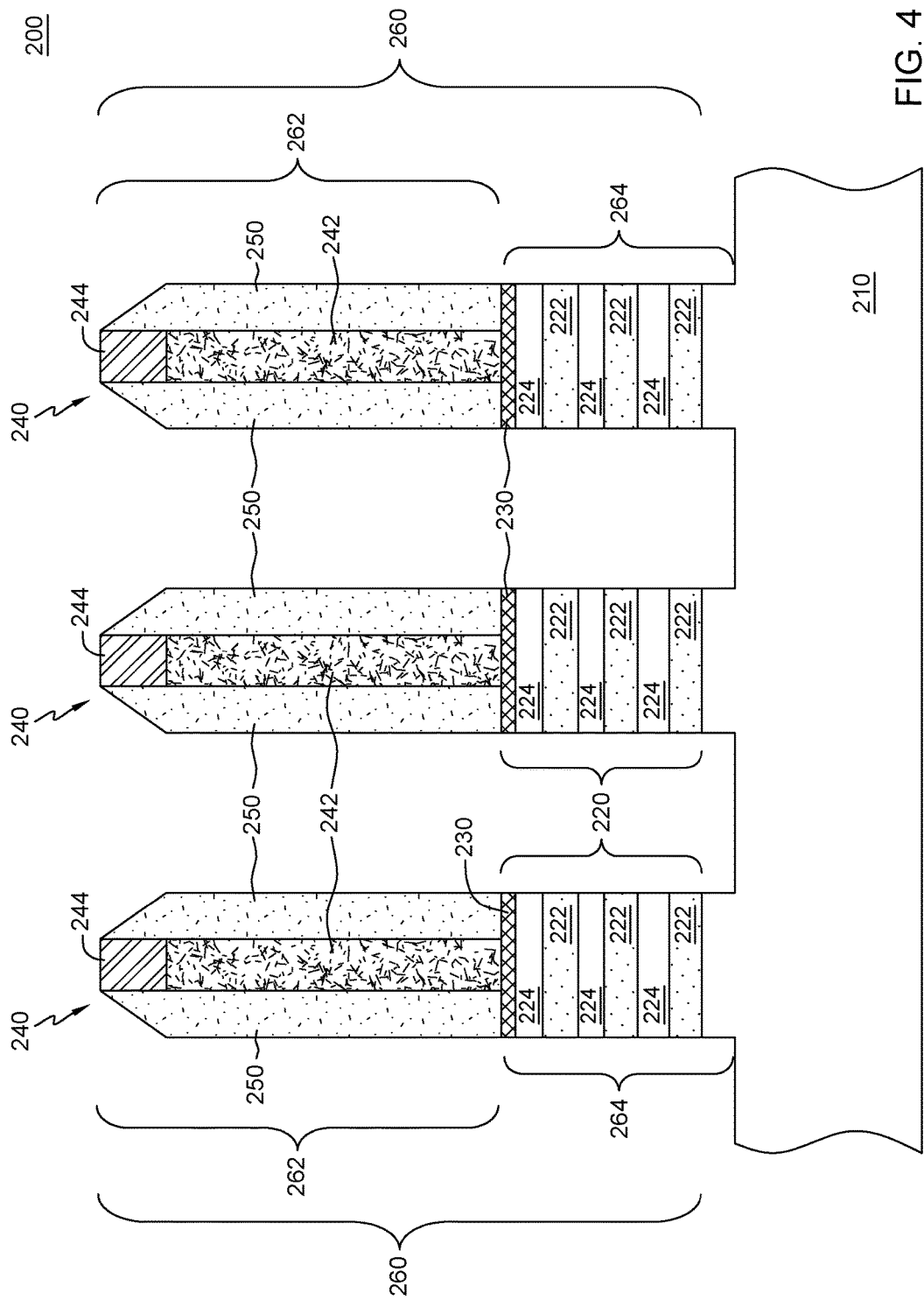
FIG. 4 depicts the structure of FIG. 3 after forming the stack structures, in accordance with one or more aspects of the present invention.

As depicted in FIG. 4, using lithography and etching processes to define the multiple layers 220, at least one stack structure 260, having an upper portion 262 and a base portion 264, may be formed. By way of example, formation of one or more stack structure 260 may be achieved by etching through the oxide pad layer 230, the multiple layers 220, and a portion of the substrate 210, using the replacement sidewall spacers 250 as a mask, so that the resulting stack structures 260 has a base portion 264 self-aligned to the upper portion 262. To be clear, the resulting stack structure 260 has an upper portion 262 that includes the gate structure 240, and a base portion 264 that includes the oxide pad layer 230 and the multiple layers 220, the base portion 264 having a width that is the same as the width of the corresponding gate structure 240 with the replacement sidewall spacers 250 positioned above it. The etching may be performed by any suitable etching process, for example, a directional reactive ion etching (RIE). An advanced process control etch may be used to, for example, define the stop layer.

Figure 5:
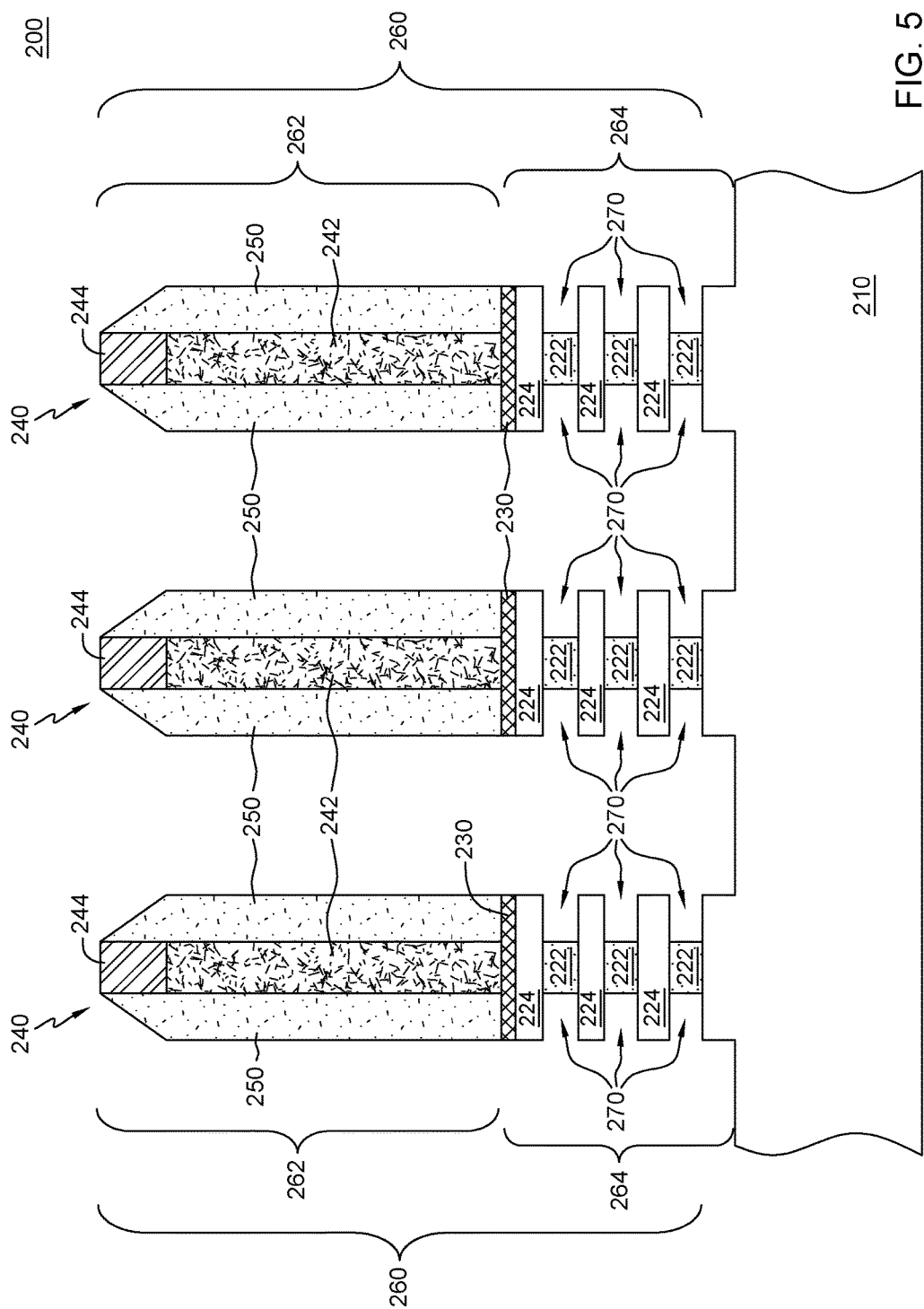
FIG. 5 depicts the structure of FIG. 4 after forming recesses in the stack structures, in accordance with one or more aspects of the present invention.

As depicted in FIG. 5, plurality of recesses 270 may be formed within the base portion 264 by any suitable etching process, for example, RIE, and may define multiple layers spacers 294. The recesses 270 may be formed by, for instance, selectively etching the first material layers 222 (i.e. the SiGe layers or channels). The remaining non-etched first material layers 222 may have a width, for example, same as the width of the gate structure 240 positioned above the base portion 264, while the second material layers 224 maintains the same width as the corresponding upper portion 262 having the gate structure 240 and the replacement sidewall spacers 250, positioned above the base portion 264. The formed recesses 270 may be uniform throughout the base portion 264, such that the recesses 270 defined at one first material layer 222 (e.g. the SiGe layer disposed on the substrate) does not, for example, differ from another recess 270 defined at another first material layer 222 (e.g. the SiGe layer disposed on a Si layer). By way of example, formation of uniform recesses 270 may be achieved by performing RIE selective to SiGe and using the Si layers as masks.

Figure 6:
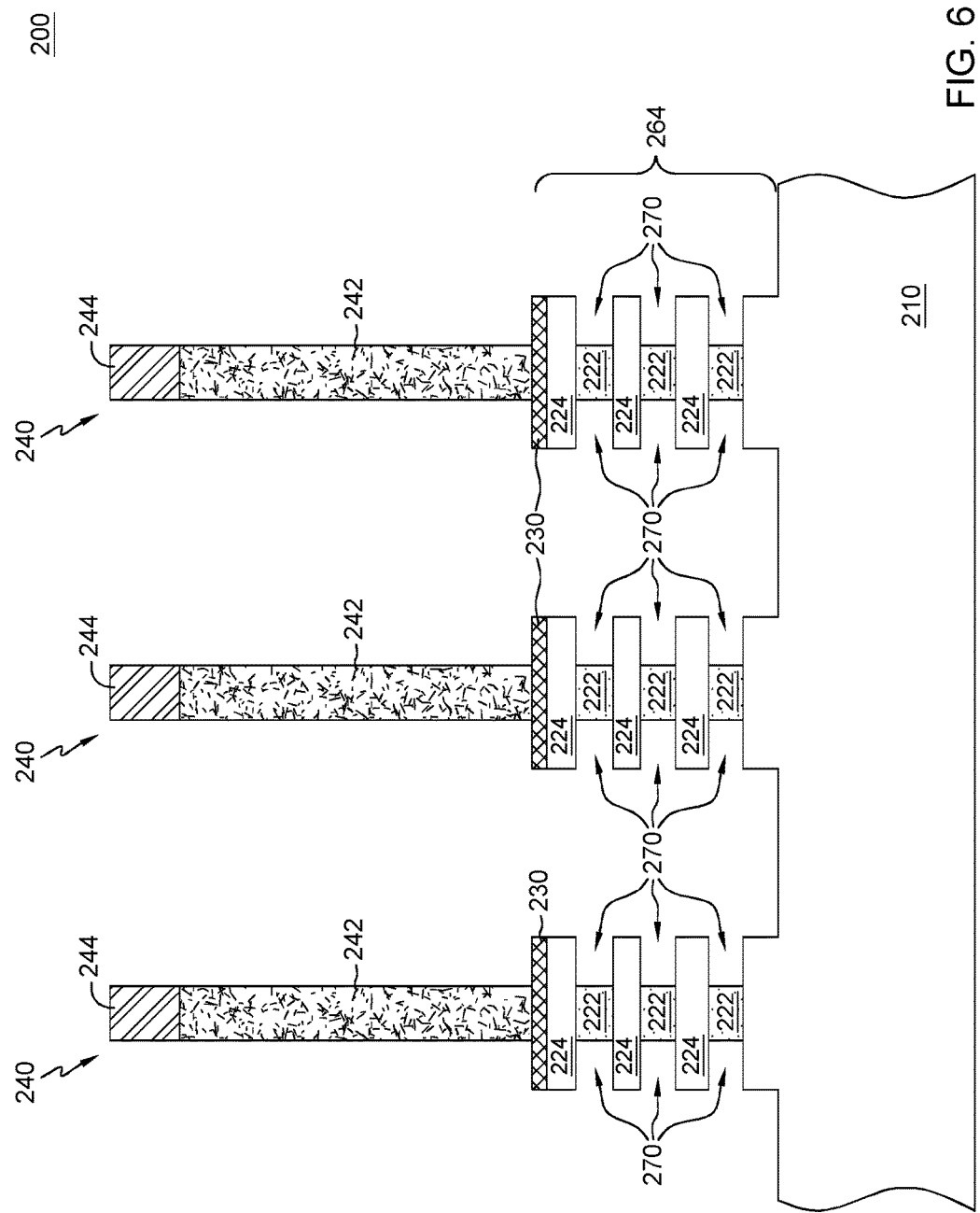
FIG. 6 depicts the structure of FIG. 5 after removing the replacement sidewall spacers from the gate structures, in accordance with one or more aspects of the present invention.

As depicted in FIG. 6, the replacement sidewall spacers 250 may be stripped or removed from the sides of the gate structure 240. The removal of the replacement sidewall spacers 250 may be performed by one skilled in the art using one or more appropriate methods, for example, selectively removing the replacement sidewall spacers 250 (e.g. $SiO_2$) using hydrofluoric acid (HF) or by chemical oxide removal (COR).

Figure 7:
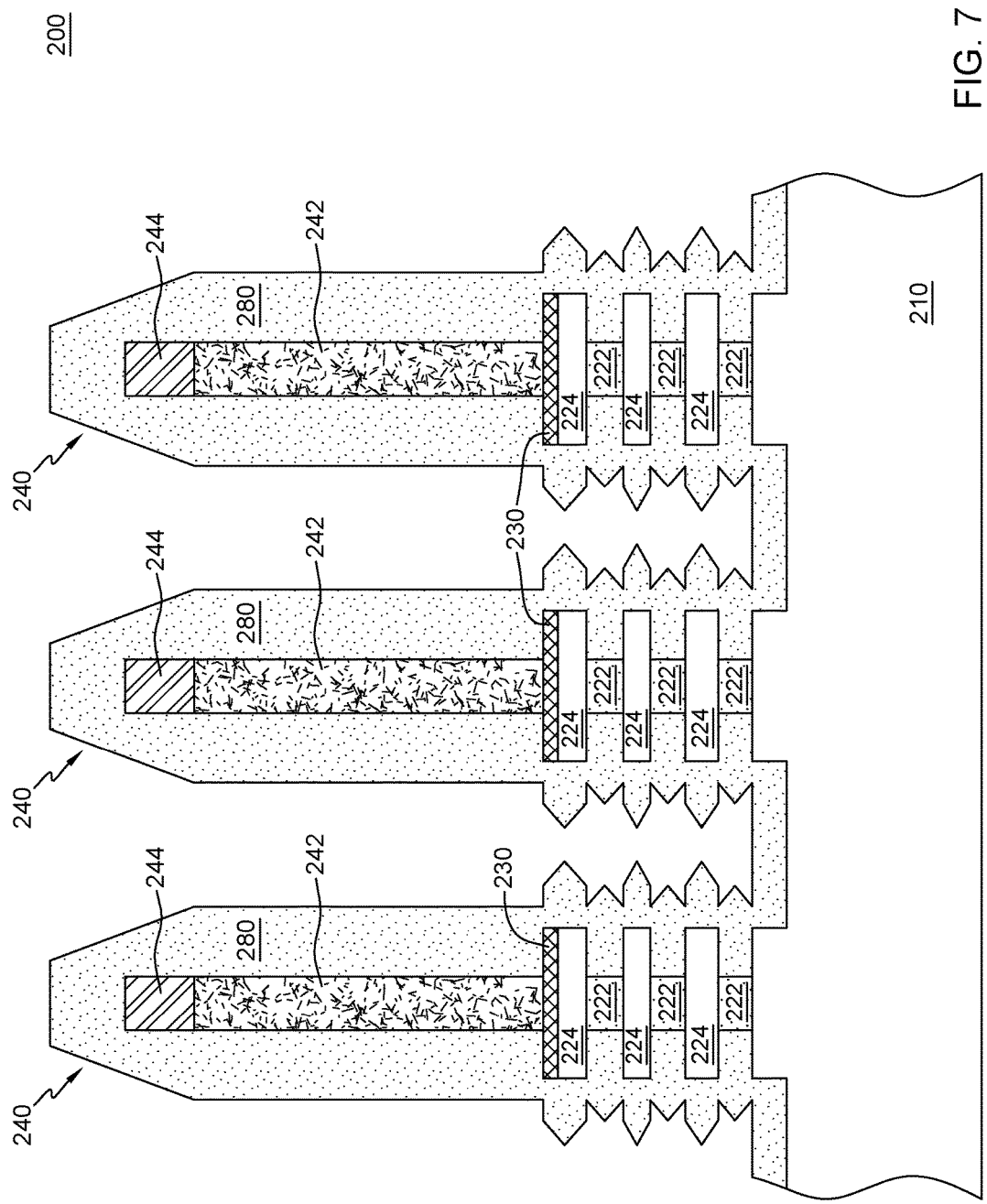
FIG. 7 depicts the structure of FIG. 6 after depositing a layer of low k material over the device, in accordance with one or more aspects of the present invention.

As depicted in FIG. 7, a layer of low k material 280 may be deposited over the device 200. The low k material layer 280 may be, for instance, conformally deposited over the device such that the plurality of formed recesses 270 are overfilled with the low k material. The low k material may be any suitable semiconductor material, such as SiBCN or SiOCN. The deposition process may be any conventional methods and techniques, for example, atomic layer deposition (ALD), chemical vapor deposition (CVD), or physical layer deposition (PVD).

Figure 8:
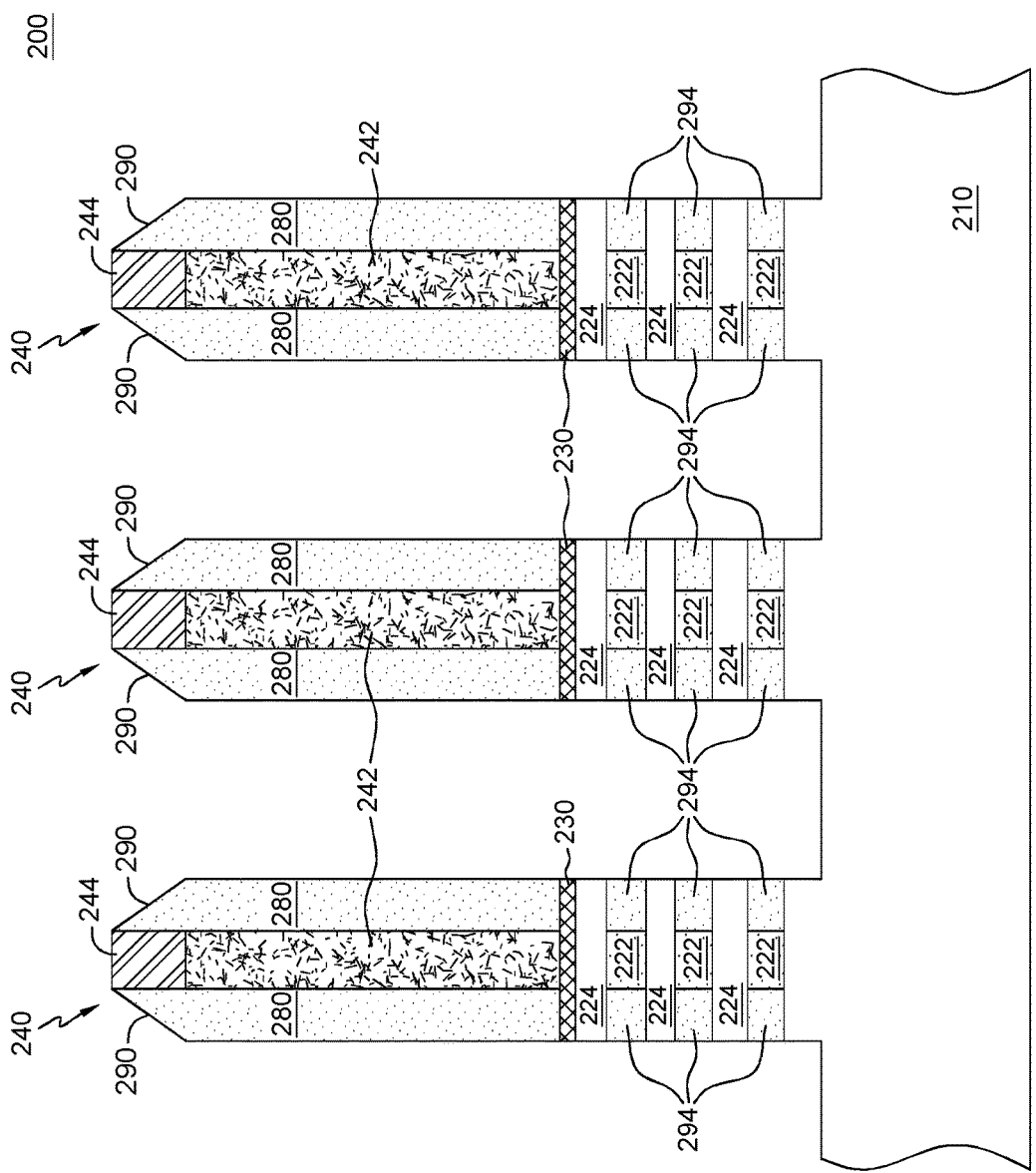
FIG. 8 depicts the structure of FIG. 7 after forming the sidewall spacers to the stack structures, in accordance with one or more aspects of the present invention.

As depicted in FIG. 8, using lithography and etching processes, the layer of low k material 280 may be etched to expose the top of the gate hard mask 244, to define or form sidewall spacers 290 positioned on the left and right sides of the at least one gate structure 240, and to define or form multiple layers spacers 294 on the side of the non-recessed first material layers 222, i.e. the sides of the remaining shortened SiGe layers or channels. By way of example, formation of uniform multiple layers spacers 294 may be achieved by etching the low k material layer 280, using the non-etched second material layers 224 as masks, so that the multiple layers spacers 294 self-align to the non-etched or non-recessed second material layers 224. In other words, the ends of the second material layers 224 serve as, for example, guides to form the multiple layers spacers 294. The etching may be performed by any suitable etching process, for example, an anisotropic etching such as a directional RIE.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor device having a substrate, multiple layers disposed on the substrate, and at least one gate structure disposed on and entirely above the multiple layers;
   depositing an oxide layer over the intermediate semiconductor device;
   etching the oxide layer to form replacement sidewall spacers positioned on left and right sides of the at least one gate structure;
   etching the multiple layers to form at least one stack structure; and
   forming a plurality of recesses within the at least one stack structure.

2. The method of claim 1 further comprising:
   removing the replacement sidewall spacers;
   depositing a layer of low k material over the intermediate semiconductor device; and
   etching the low k material layer to form sidewall spacers to the left and right sides of the at least one gate structure and at least one stack structure, respectively.

3. The method of claim 1, wherein the intermediate semiconductor device further comprises an oxide pad layer disposed on the multiple layers.

4. The method of claim 1, wherein the etching the oxide layer is a reactive ion etching (RIE).

5. The method of claim 1, wherein the oxide layer is conformal.

6. The method of claim 2, wherein the layer of low k material is conformal.

7. The method of claim 1, wherein the multiple layers comprise multiple alternating layers of a first material layer and a second material layer.

8. The method of claim 7, wherein the first material layer of the multiple alternating layers comprises silicon germanium.

9. The method of claim 8, wherein the second material layer of the multiple alternating layers comprises silicon.

10. The method of claim 1, wherein the at least one gate structure comprises:
    a gate; and
    a gate hard mask disposed on the gate.

* * * * *